United States Patent
Frost et al.

(10) Patent No.: US 7,258,965 B2
(45) Date of Patent: *Aug. 21, 2007

(54) PRE-EXPOSURE OF PATTERNED PHOTORESIST FILMS TO ACHIEVE CRITICAL DIMENSION REDUCTION DURING TEMPERATURE REFLOW

(75) Inventors: Rex K. Frost, Hillsboro, OR (US); Swaminathan Sivakumar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 370 days.

This patent is subject to a terminal disclaimer.

(21) Appl. No.: 10/750,053

(22) Filed: Dec. 30, 2003

(65) Prior Publication Data
US 2005/0147928 A1    Jul. 7, 2005

(51) Int. Cl.
*G03F 7/26*    (2006.01)
(52) U.S. Cl. ...................................... 430/313; 430/330
(58) Field of Classification Search ................ 430/311, 430/322, 328, 330, 313
See application file for complete search history.

(56) References Cited

U.S. PATENT DOCUMENTS

| 6,117,622 | A  | * | 9/2000  | Eisele et al. ................. 430/328 |
| 6,210,843 | B1 |   | 4/2001  | Chen et al. |
| 6,503,693 | B1 | * | 1/2003  | Mohondro et al. .......... 430/328 |
| 6,864,144 | B2 |   | 3/2005  | Kenyon et al. |
| 6,977,219 | B2 |   | 12/2005 | Frost et al. |
| 2005/0081178 | A1 | | 4/2005  | Swaminathan et al. |
| 2005/0148169 | A1 | | 7/2005  | Frost et al. |

* cited by examiner

*Primary Examiner*—Kathleen Duda
(74) *Attorney, Agent, or Firm*—Blakely, Sokoloff, Taylor & Zafman LLP (57) ABSTRACT

The present invention relates to the reduction of critical dimensions and the reduction of feature sizes in manufacturing integrated circuits. Specifically, the method controls photoresist flow rates to develop critical dimensions beyond the resolution limits of the photoresist material used, and the limits of lithographic tool sets. The resist material characteristics are modified by exposing the resist pattern to either electrons, photons, or ions. The exposure modifies the glass transition temperature, cross linking characteristics, decomposition temperature, or molecular weight of the resist material. The post-exposure resist is then easier to control during a subsequent reflow process to reduce the hole size or line size of the patterned resist.

25 Claims, 7 Drawing Sheets

|  | No Treatment | CD-Shrink Only | DUV-Cure + CD-Shrink |
|---|---|---|---|
| Isolated Contact | 126 | 106 | 48 |
| Nestled Contact | 136 | 102 | 62 |

FIG. 5

PRE-EXPOSURE OF PATTERNED PHOTORESIST FILMS TO ACHIEVE CRITICAL DIMENSION REDUCTION DURING TEMPERATURE REFLOW

FIELD

The present invention relates to the field of manufacturing of integrated circuits and more specifically to the reduction of patterned openings and lines in a resist layer to improve the critical dimension and reduce integrated circuit feature sizes.

BACKGROUND

The effort to build integrated circuits with more and faster semiconductor devices has a resulted in a continued shrinking of the devices within an integrated circuit. This corresponds to a reduction in the size and spacing of the individual transistors and interconnections in an integrated circuit. In many applications, the switching speed and size of the switching devices are functions of the critical dimension of the MOS transistor gate and interconnections to each device. Narrower or smaller device geometries tend to produce a higher performance or faster switching transistor. For example, in circuits having MOS switching devices, a very important process step is the formation of the gate for each transistor and the formation of the interconnection paths to connect each device to form, for example, a processor integrated circuit.

The continued reduction in integrated circuit geometry sizes improves the functionalities and pricing of the integrated circuit, however, the reduction in geometry sizes continues to challenge process designers and manufacturers. The limitations of conventional lithographic techniques used to pattern transistor gates and interconnects are quickly being realized. Accordingly, there is a continuing need for more efficient and effective fabrication processes for forming transistor gates and interconnects that are smaller and/or exhibit higher performance.

In conventional lithographic techniques, the surface of a silicon substrate wafer is coated with a light sensitive photoresist material. Once the photoresist material is formed on the surface of the silicon substrate, the wafer is aligned and the photoresist is exposed using a photo mask and a high intensity light source. The photo resist is developed, and the excess or unwanted photo resist is removed. The remaining photoresist forms a patterned mask over the surface of the silicon substrate, and is usually subjected to a baking or heating process to harden the photoresist and improve its adhesion to the substrate. The patterned photoresist mask then acts a barrier during an etch process used in the formation of semiconductor or interconnect features in an integrated circuit.

The patterned mask has characteristic qualities and limitations with regard to its ability to maintain a uniform thickness across the substrate wafer, its adhesion qualities to the substrate surface, and its ability to uniformly maintain critical dimensions transferred to it through the formation, mask exposure, development, baking, and etch processes. Design and process engineers must weigh a multitude of factors in reducing the critical dimensions in the fabrication process. Factors relating to the photoresist include thickness uniformity, the ability to hold a pattern, proximity effects during the baking process, and etch resistance. These factors and others effectively define the resolution limit of the photoresist materials.

A critical dimension in the photoresist that is narrower than the photoresist resolution limit is generally incapable of providing an effective mask in the fabrication of a gate or interconnect. The results of using narrow dimensions beyond the resolution limit of the photoresist includes pattern collapse, bending, and pattern closures caused by proximity effects during the baking or reflow process. In addition, attempts to reduce the critical dimension by heating the resist to reflow, results in the closure of resist openings where openings are less dense or isolated in the resist mask pattern.

Figure 1A:
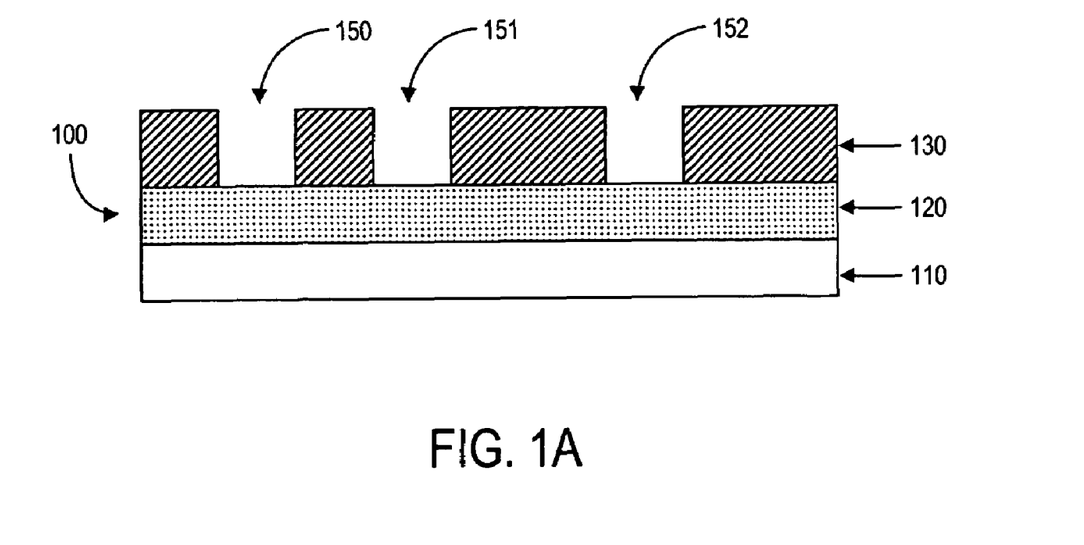
FIG. 1A illustrates a cross sectional view of a prior art patterned resist layer formed above a dielectric layer of a substrate.
Figure 1B:
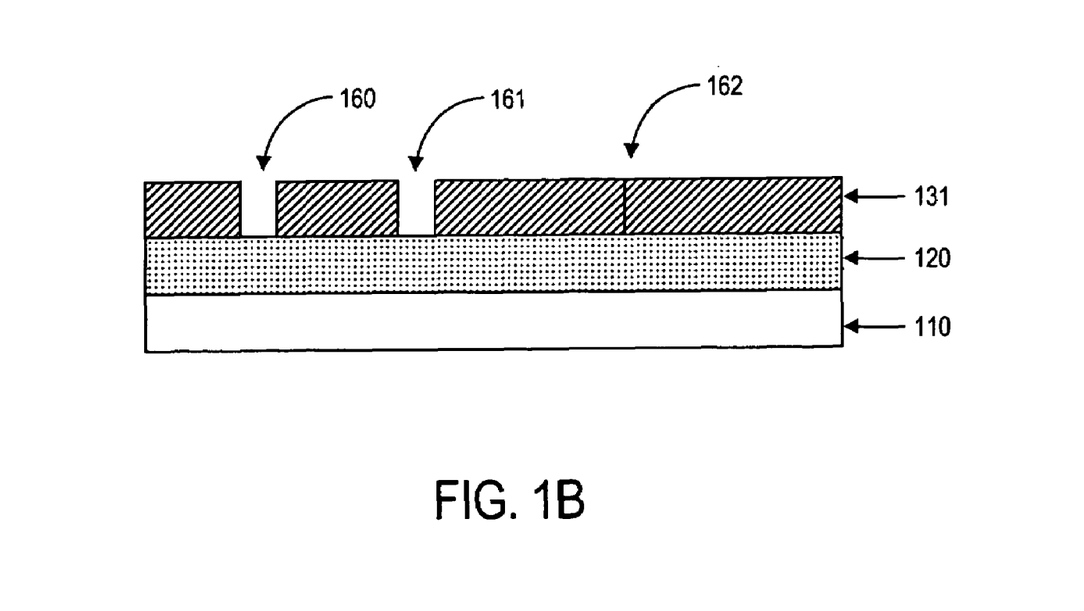
FIG. 1B illustrates a cross sectional view of the patterned resist of FIG. 1A after reflow.

In particular in the example shown in FIG. 1A, the structure 100, is based on a substrate 110, a dielectric layer 120, and a photoresist layer that has been subjected to the normal spin, exposure, development, and wash processes 130. The photoresist mask 130, contains an opening 150, and 151, in close proximity and an isolated opening 152. In a standard procedure following the exposure and development of a photoresist, a baking step is normally used to harden the photoresist and to improve adhesion to the surface of the substrate. Heating the resist material above the glass transition temperature of the resist material, to reflow, might be used to reduce the critical dimension of the photoresist pattern. However, holes and line patterns in the photoresist do not shrink or expand at the same rate. Heating the photoresist to reflow causes the resist to migrate at a rate that is difficult to control and some openings in the photoresist layer close. The problem also occurs when the density of openings in a patterned resist layer varies. In areas of the photoresist mask where holes are isolated, the proximity effect and the photoresist reflow causes the isolated opening to collapse and close. This is illustrated in FIG. 1B showing an isolated opening 162 that has closed while resist openings 160 and 161 do not collapse. The loss of the opening 162 is an unacceptable result.

DETAILED DESCRIPTION

Described is a method for controlling a photoresist layer during a reflow process to develop critical dimensions beyond the resolution limit of the photoresist material, and to overcome problems associated with varying hole and line densities. After the photoresist film has been applied to a substrate, exposed, and developed, the patterned resist is exposed to electrons, photons, or ions, which modify the photoresist molecular structure. Modification of the photoresist molecular structure results in a modification of the photoresist reflow characteristics which results in improved control over the rate that the resist collapses or flows into openings or lines in the photoresist pattern.

Figure 2A:
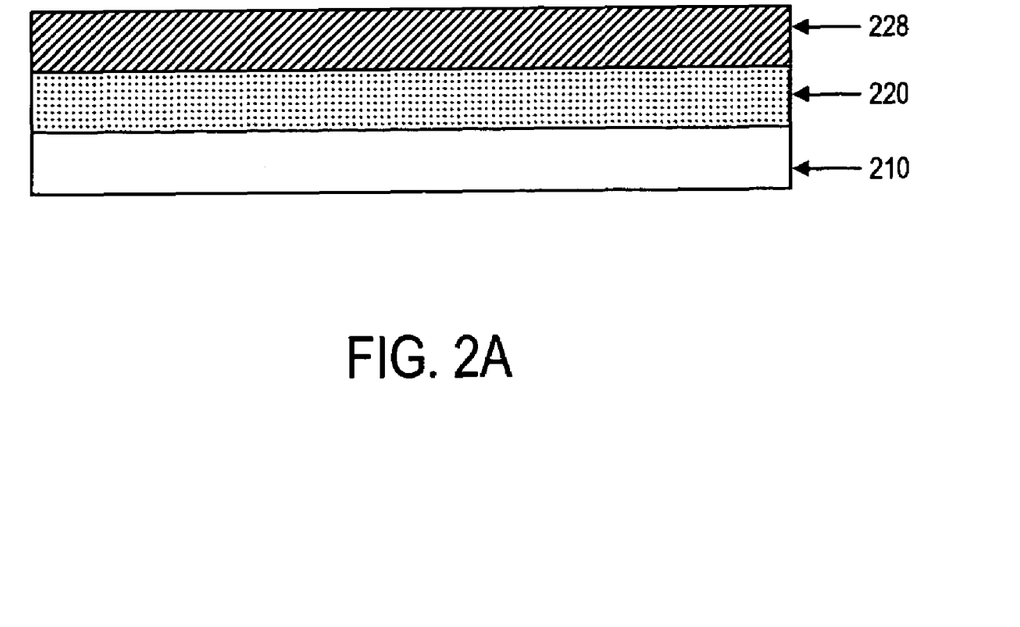
FIGS. 2A-2E illustrate a method to achieve critical dimension reduction in a photoresist film.

In one embodiment, as show in FIG. 2A, an underlying substrate 210 contains formed switching devices, with an inter level dielectric layer 220 formed above the substrate in preparation for forming conductive interconnects. However, in other embodiments, the underlying substrate may contain partially formed switching devices with the intent of forming features to the partially formed devices. After a photoresist layer 228, is formed or spun above a substrate 220, in FIG. 2B, the photoresist layer is exposed, developed, and further processed to remove any unwanted resist or contaminants to develop a patterned resist mask 230. In one embodiment, a post development soft bake process, executed below the resist glass transition temperature, is not employed. In another embodiment, the patterned resist may be subject to a post development soft bake process as a dehydration step, executed below the glass transition temperature for the particular resist material being used.

Figure 2B:
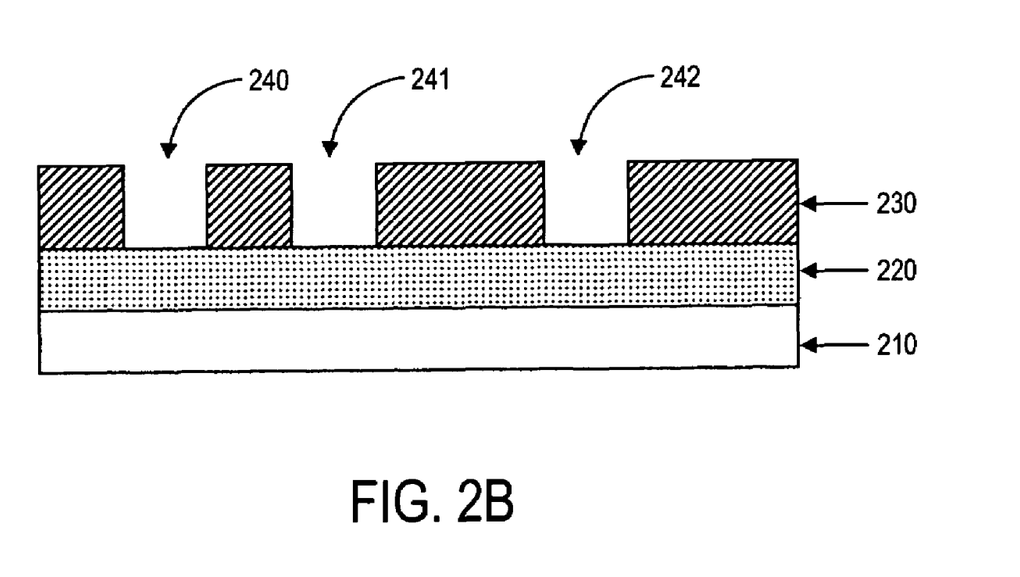

In one embodiment, a 193 nm sensitive resist material, is used. However, a variety of standard resist materials may be used, for example, any chemically amplified or non-chemically amplified resist material, such as I-line, ArF, EUV, or resists sensitive to 248 nm, 193 nm, or 157 nm light sources. Typical 193 nm resists include acrylate, methacrylate and other hybrids. Also, the geometry size does not particularly matter, and it is possible to implement the process using 248 nm geometries or smaller. As shown in FIG. 2B, the patterned photoresist 230, with openings 240, 241, and 242 would have acted as a mask to expose the underlying substrate 220 to an etch process. However, smaller openings are desired.

Figure 2C:
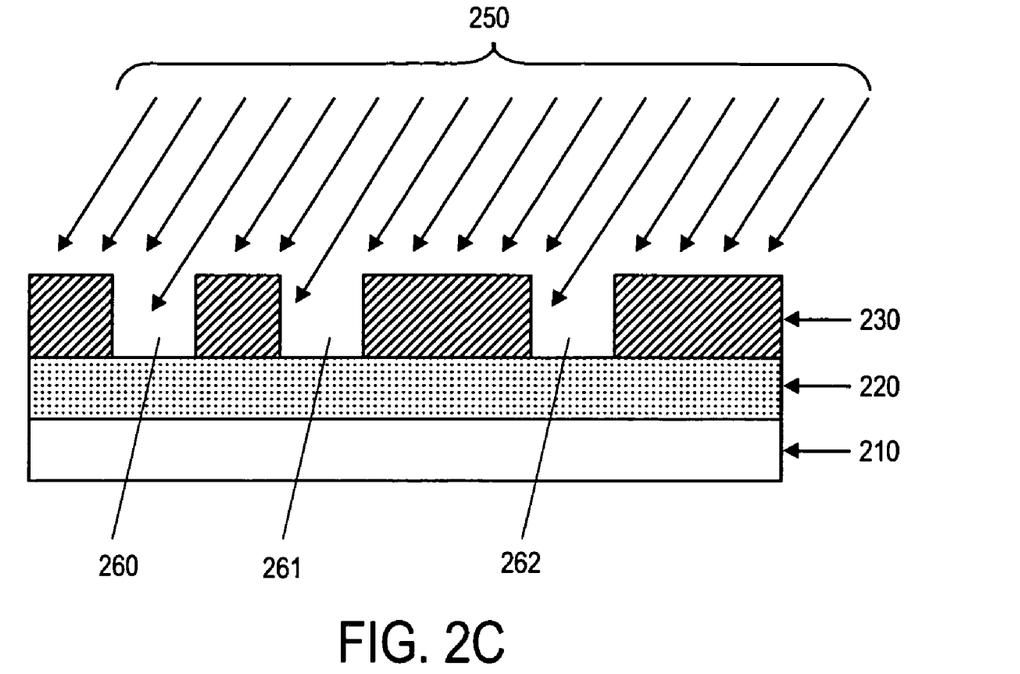

Next, as shown in FIG. 2C, the patterned photoresist layer is exposed 250, either to an electron beam, a light source, an ion source, or a combination of sources. In one embodiment, using a 193 nm sensitive methacrylate film, an electron beam flood exposure is performed, using an ElectronVision ECA3C, and implemented at 1.5K to 2.5K electron volts, with a density of 2,000 micro-Coulombs per square centimeter, at a normal angle of exposure, is performed for between 20 to 40 seconds. A variety of resist materials may be used, and the exposure parameters may vary outside of the above ranges, depending on the individual and specific photoresist that is being used. Variations in the parameters for each resist film is generally governed by the absorption cross-section and required de-protection energies of the individual resist material being used. The general formula or parameters may be easily changed to vary the exposure of a particular photoresist to optimize each resist material's characteristics.

The electron beam exposure of the photoresist results in a polymer modification, a de-protection, or decomposition modification of the photoresist material. The electron beam may cleave the backbone of the polymer or create a cross-linking mechanism that results in a modification to the molecular weight and/or the glass transition temperature of the resist. Typical methacrylate resists normally have Tg of approximately 150-170 C. An electron beam exposure will normally reduce this value to approximately 120-140 C. Without cleaving the backbone of the resist material, the molecular weight is expected to change by approximately 10% to 30%. However, depending on the photoresist material used and the electron beam exposure parameters, the invention is not limited to these particular modifications to the molecular structure of the photoresist material.

Alternately, a patterned photoresist film may be exposed to photons or ions, resulting in similar beneficial changes to the resist film material. In one embodiment, the photoresist material is exposed to a light source such as a flash lamp, at a variety of frequencies, for example at wavelengths of 193 nm or 248 nm. Exposure conditions are normally kept below the solvation-switch deprotection threshold (E0), and will generally be governed by the relative cross-section of the resist film.

In one embodiment using a 193 nm sensitive methacrylate film, a flood exposure of approximately 4 to 6 mJoules per square centimeter for approximately 30 seconds will yield a change in the resist characteristics. In another embodiment, for a 248 nm sensitive film, an exposure to a light source at approximately 10 mJoules per square centimeter for approximately 30 seconds will modify the resist characteristics. Exposing a variety of resist types to a photon source at densities similar to the embodiments described above will alter the characteristics of a resist film. Although the above embodiments are for 193 nm and 248 nm sensitive resist films with exposure to a corresponding light source, a variety of wavelengths and light sources may be used.

Figure 2D:
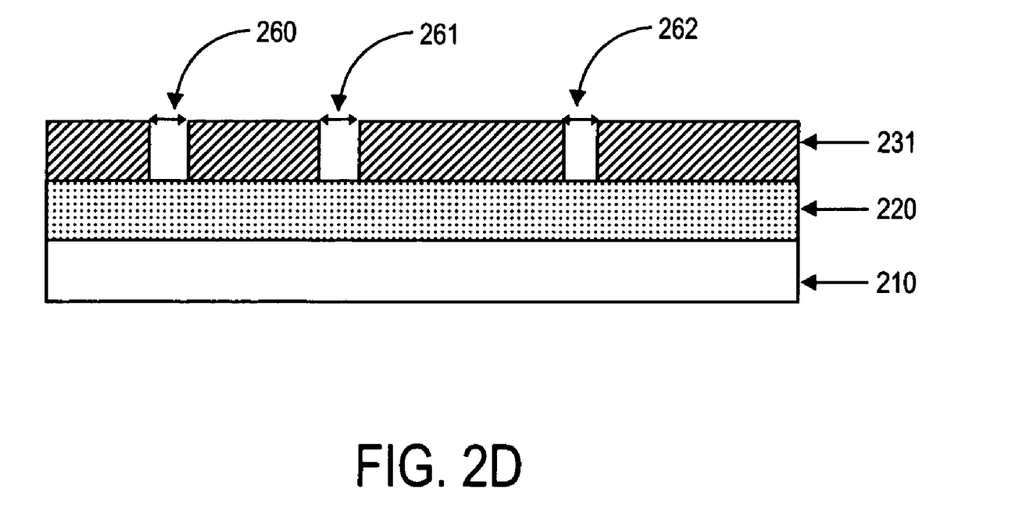

Next, a patterned resist exposure is followed by a thermal reflow by heating the photoresist to or beyond its post exposure glass transition temperature. FIG. 2D illustrates a substrate 210, an inter-level dielectric layer 220, and a patterned photoresist film 231, after having been exposed to electrons, photons, or ions, and subsequently heated to or beyond the glass transition temperature. A post-exposure resist will provide improved control and more uniform opening sizes without closure or collapse, from the proximity effect during a reflow, in comparison to the same resist material that was not exposed. The openings 260 and 261 have been reduced, and isolated opening 262 will experience a similar reduction in opening size without collapse, in comparison to the pre-exposure resist patterns shown in FIG. 2B. The exposure, having modified the resist material to create a more uniform shrinkage characteristic, provides the ability to control the shrinkage rate during a subsequent resist reflow process to reduce the opening or line of a resist pattern.

In one embodiment, the exposure of a photoresist material to an electron beam subsequently followed by a thermal reflow process modifies the observed reflow magnitude response of the photoresist by approximately 10 to 15 percent. A photoresist exposed to an electron beam using the above method, compared to photoresist that has not been exposed, will exhibit a more uniform shrinkage rate of openings in the photoresist relative to a varying pitch or distance between patterned resist openings or lines. In one embodiment, after exposure to an electron beam, the photoresist layer is then heated to or beyond the post exposure glass transition temperature of the photoresist material to between 125 to 180 degrees Centigrade for 60 to 90 seconds. This operating range may be used for various resist materials. However, the bake requirements or ranges will be different for each resist material depending on the glass transition temperature (Tg) of the resist polymer. In general, pure acrylate resists are expected to have a glass transition temperature (Tg) appropriate for thermal reflow, but typically have a less competitive lithographic resolution. Resists with more methacrylate character typically have better lithographic performance but have a relatively high Tg. In one embodiment, a single resist was used, but final optimized solutions would normally employ different resins. It is not expected that one solution would necessarily provide a lower fundamental critical dimension (CD) limit than another.

Modifying the resist response at or above the glass transition temperature provides better control over the reduction rate of the photoresist layer openings and provides a reduction of the critical dimension to below the resolution of a lithographic tool set or below the photoresist fundamental resolution. The modification of the photoresist molecular structure also produces a change in the glass transition temperature (Tg). A modification to the glass transition temperature will allow matching a resist's characteristics to a desired heating process.

Figure 2E:
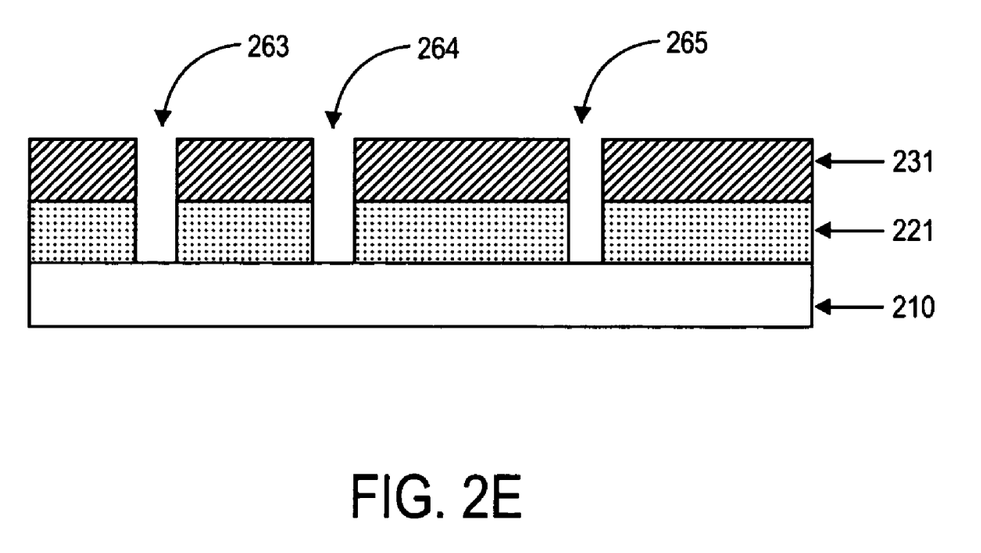

Using the above exposure method, a decrease in a critical dimension in a patterned resist layer in preparation for a subsequent etch process may be achieved. A variety of etch techniques are applicable, such as a wet or gaseous chemical or isotropic etch, or a dry plasma, reactive ion, or anisotropic etch to either develop device interconnections or to develop features of a switching device such as an MOS transitor. In FIG. 2E, the etch process creates openings 263, 264, and 265, in dielectric layer 221 that are smaller than the resist openings produced by a lithographic tool set, or the fundamental resolution of the photoresist, as illustrated in FIG. 2B as 240, 241, and 242. The etch process may be used to form the openings for conductive interconnections between electronic or digital switching devices or to form the feature of an electronic or digital switching device.

Figure 3:
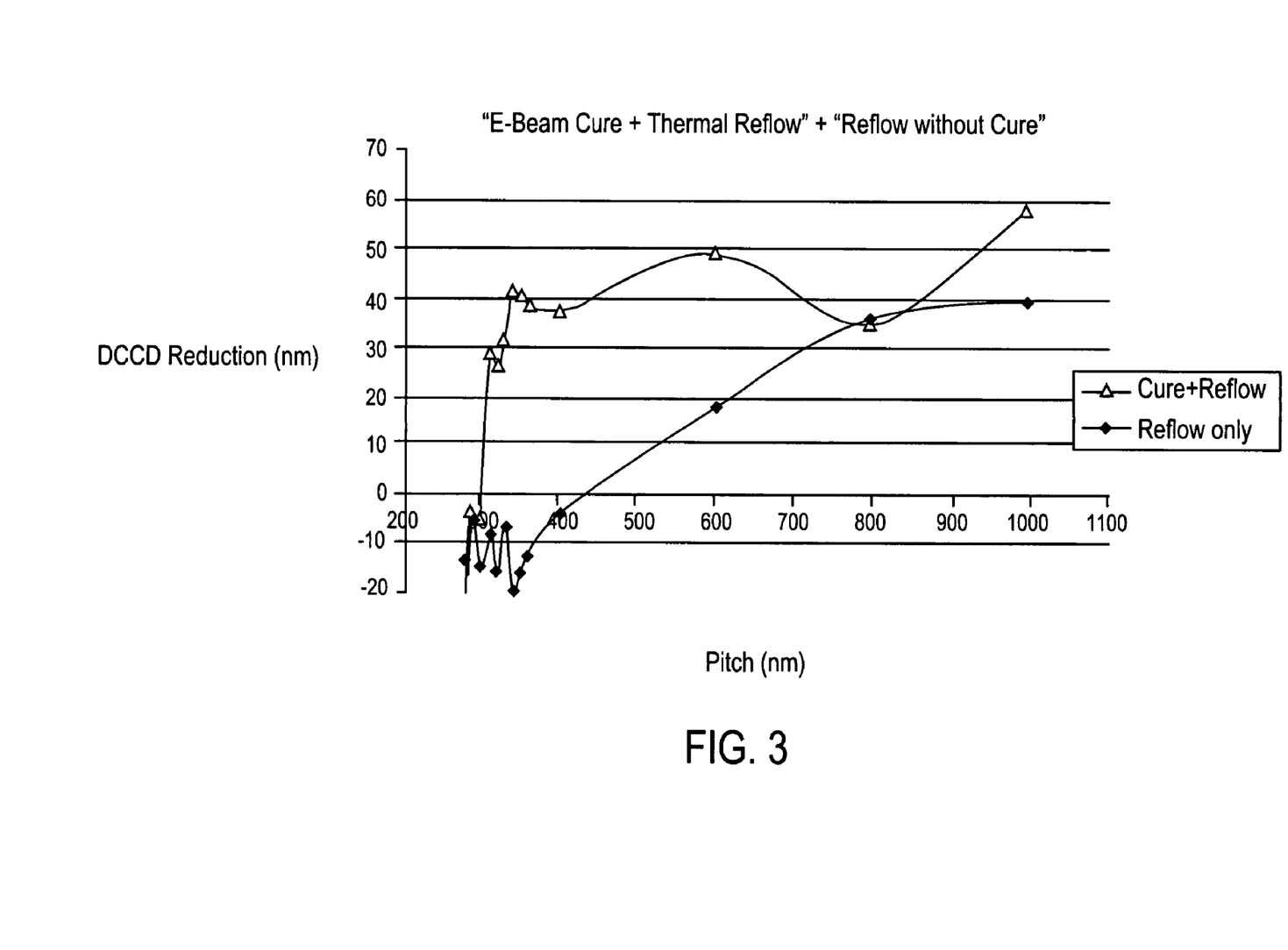
FIG. 3 shows a chart of resist film contact hole diameter (DCCD) reduction versus pitch. Electron beam exposed resist reflow is compared to reflow of resist without exposure.

In FIG. 3, an "electron beam exposure/cure plus reflow" is compared to a "resist reflow without electron beam cure." The measurements are compared in chart format as "resist film contact hole diameter reduction DCCD (develop check critical dimension) versus pitch." The chart indicates that a beneficial critical dimension reduction is not achieved at tighter pitches without the electron beam exposure step. The "electron-beam cure followed by reflow" curve is relatively flat from approximately a 300 nm pitch to 900 nm pitch in comparison to the same resist material that has not been subjected to the electron beam exposure. In this embodiment, the exposed resist pattern exhibits a controllable 10 to 15 percent reduction in the critical dimension. In addition, for the "electron-beam cure followed by reflow" resist, the shrinkage with respect to pitch is fairly constant, indicating a reduction in the proximity effect for the resist material that has been exposed. The curves in FIG. 3 indicate that an electron beam exposure of photoresist material will mitigate pitch related resist problems when the resist film reflows and shrinkage occurs.

Figure 4:
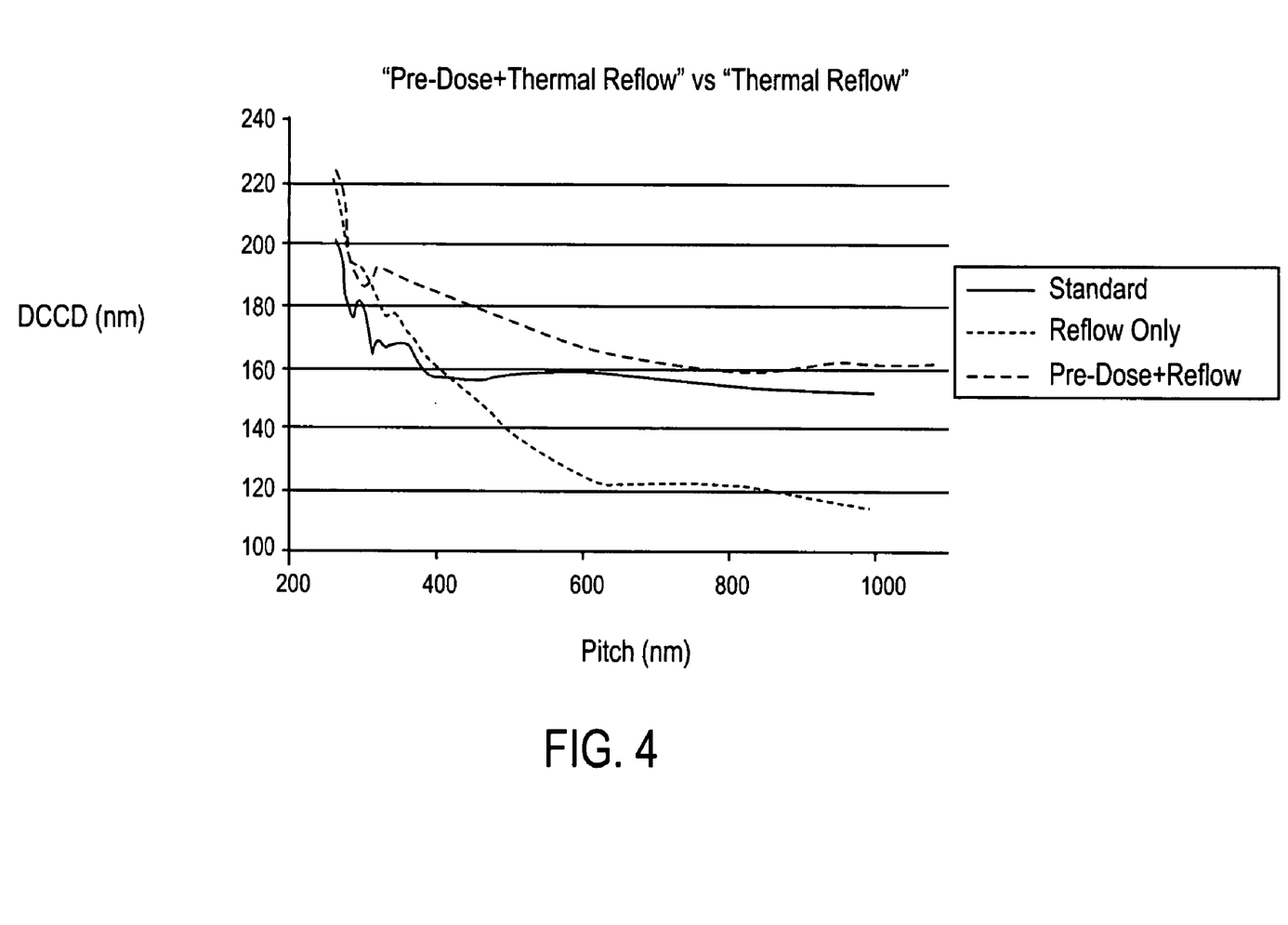
FIG. 4 shows a chart of resist film contact hole diameter (DCCD) versus pitch. Pre-exposure of the resist material at 193 nm followed by thermal reflow is compared to reflow of resist without exposure and to a standard resist process.

In FIG. 4, pre-exposure to a 193 nm light source followed by thermal reflow is compared to reflow only and a standard lithographic process with no treatment. FIG. 4 compares: 1) a lithography patterned resist, 2) the same resist material heated to or beyond its glass transition temperature to reflow, and 3) the same resist material exposed to a 193 nm light source followed by thermal reflow. For the resist subjected to a standard lithography process, the response in comparison to pitch is linear from approximately 400 nm to 1,000 nm. In comparison, the resist material without exposure but with reflow exhibits a rapid and non-uniform shrink rate, causing closures due to the proximity effect of the resist material. The reflow curve for the resist that has been exposed to the 193 nm light source provides improved control and uniformity in comparison to the resist that was not exposed. The data curves indicate a beneficial critical dimension reduction is not achieved at tight pitch without exposure.

The above exposure parameters may be varied to modify changes to the resist characteristics during reflow. In FIG. 4, the reflow curve lies above both the standard resist lithography process and the non-exposed resist with reflow curve. However, an exposed resist material's curve may be adjusted above or below the lithography and reflow only resist curves.

Figure 5:
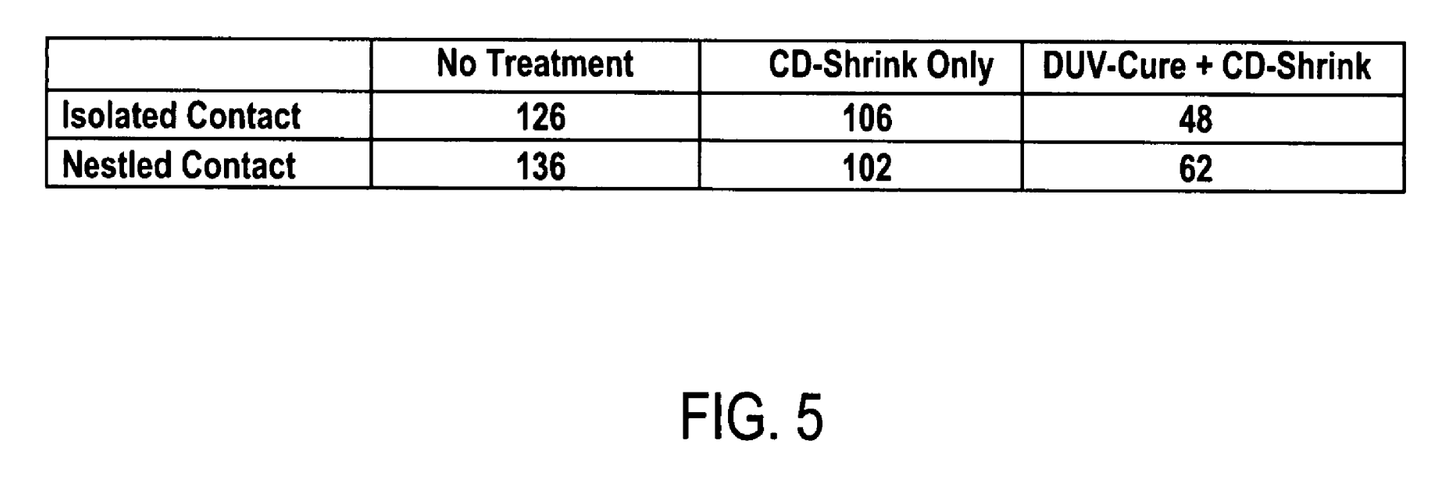
FIG. 5 shows a table of resist film contact hole diameter (DCCD) shrinkage comparing resist exposure at 248 nm followed by CD-shrink, to CD-shrink only, and to the resist with no exposure or reflow.

FIG. 5 shows similar data for a photoresist material exposed to a 248 nm light source. The data indicates that the thermal processing is constant between the resist materials that have been subjected to reflow, with a greater available control of shrinkage for the resist material that has been exposed.

The patterned resist may also be exposed to ions by accelerating charged atoms to expose and/or cleave the molecular backbone structure of the resist material. In this embodiment of using an ion source to expose the resist, the same result of modifying the reflow characteristics and the glass transition temperature of various photoresist materials will also be achieved. The process of exposing the photoresist layer to electrons, photons, or ions may be used to modify the thermal response or reflow characteristics and to modify the resist glass transition temperature, to match the post exposure resist characteristics to a desired process. For example, matching the resist reflow and glass transition characteristics to preferred heating and temperature profiles.

It can be seen in FIGS. 3, 4, and 5 that the reflow curve of a resist material that has been pre-exposed to an electron beam or a photon source, may yield more control over a subsequent thermal reflow process. The photoresist materials used in the described embodiments have been shown to provide a variety of response changes and a variety of changes to the glass transition temperatures related to a variety of photoresist materials when compared to a variety of exposure processes. Also, a variety of embodiments of the invention provide the ability to modulate and control the shrinkage characteristics of the resist material during reflow.

In the described method above, a photoresist material has been shown to provide a variety of reflow responses related to an exposure process. The process of exposing a patterned photoresist layer to an electron beam, photon, or ion source may be used to modify the thermal response or reflow characteristics of a resist material to control the rate in which openings or lines shrink, ultimately controlling at least one critical dimension in a semiconductor or integrated circuit manufacturing process.

Alternate embodiments of the invention may provide the ability to modulate and control the shrinkage characteristics of a variety of resist materials. Although the embodiments described may represent specific resist materials subjected to specific exposure parameters, using alternate resists, other solvents or combination of solvents, and alternate exposure parameters will provide similar beneficial modifications to the resist reflow response. In addition, a particular resist material may be matched to a desired thermal cycle to keep the resist layer below a degradation point.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure the present invention.

What is claimed is:

1. A method of controlling a photoresist layer above a substrate comprising:
    forming, exposing, and developing the photoresist layer, forming at least one opening having a first dimension;
    exposing the photoresist layer with the at least one opening to modify the photoresist layer characteristics after developing the photoresist layer; and
    heating the photoresist layer with the at least one opening, after exposing the photoresist layer with the at least one opening, to achieve a thermal reflow of the photoresist layer with the at least one opening to modify the dimension of the at least one opening in the photoresist layer.

2. The method of claim 1 wherein exposing the photoresist layer with the at least one opening causes a mitigation of bulk expansion of the photoresist layer during reflow.

3. The method of claim 1 wherein exposing the photoresist layer with the at least one opening is selected from the group consisting of exposing to photons, exposing to electrons, and exposing to ions.

4. The method of claim 1 wherein heating the photoresist layer with the at least one opening to achieve a thermal reflow controls formation of a critical dimension that is less than a resolution of a lithographic tool set.

5. The method of claim 1 wherein heating the photoresist layer with the at least one opening to achieve a thermal reflow controls formation of a critical dimension that is less than a fundamental resolution of the photoresist layer.

6. The method of claim 1 wherein heating the photoresist layer to modify the dimension of the at least one opening in the photoresist layer decreases the dimension of the opening in the photoresist layer.

7. The method of claim 1, further comprising etching the photoresist layer with the at least one opening to form the etched feature.

8. A method of controlling a photoresist layer above a substrate comprising:
    forming, exposing, and developing the photoresist layer, forming at least one opening having a first dimension;
    exposing the photoresist layer with the at least one opening to an electron beam causing a reduction of bulk expansion of the photoresist layer during a subsequent reflow; and
    heating the photoresist layer with the at least one opening, after exposing the photoresist layer with the at least one opening, to achieve a thermal reflow of the photoresist layer to decrease the first dimension of the at least one opening in the photoresist layer.

9. The method of claim 8 wherein the electron beam is generated using an electron beam exposure device, implemented at 1.5K to 2.5K electron volts, for between 20 to 40 seconds.

10. The method of claim 8 wherein the photoresist layer with the at least one opening is exposed to the electron beam at 1.5K to 2.5K electron volts, with a density of about 2,000 micro-Coulombs per square centimeter, for between 20 to 40 seconds.

11. The method of claim 8 wherein exposing the photoresist layer with the at least one opening to the electron beam modifies at least one photoresist layer characteristic selected from the group consisting of a cross linking characteristic, a glass transition temperature, a decomposition temperature, and a molecular weight.

12. The process of claim 8 wherein heating controls the formation of a photoresist layer critical dimension.

13. The process of claim 8 wherein the heating is performed at 125 to 180 degrees Centigrade for 60 to 90 seconds.

14. A method of controlling a photoresist layer above a substrate comprising:
    forming, exposing, and developing the photoresist layer, forming at least one opening having a first dimension;
    exposing the photoresist layer with the at least one opening to a light source causing a reduction of bulk expansion of the photoresist layer during a subsequent reflow; and
    heating the photoresist layer with the at least one opening, after exposing the photoresist layer with the at least one opening, to achieve a thermal reflow of the photoresist layer to decrease the first dimension of the at least one opening in the photoresist layer.

15. The method of claim 14 wherein the photoresist layer formed on the substrate is 193 nm in thickness.

16. The method of claim 14 wherein the photoresist layer formed on the underlying substrate is 248 nm in thickness.

17. The method of claim 14 wherein the light source comprises a flash-lamp.

18. The method of claim 17 wherein exposure conditions used to expose the photoresist layer with the at least one opening are kept below a solvation-switch deprotection threshold.

19. The method of claim 17 wherein the light source has a wavelength of 193 nm.

20. The method of claim 19 wherein the light source subjects the photoresist layer with the at least one opening to approximately 4 to 6 mJoules per square centimeter for approximately 30 seconds.

21. The method of claim 17 wherein the light source has a wavelength of 248 nm.

22. The method of claim 21 wherein the light source subjects the photoresist layer with the at least one opening to approximately 10 mJoules per square centimeter for approximately 30 seconds.

23. The method of claim 14 wherein exposing the photoresist layer with the at least one opening to the light source modifies at least one photoresist layer characteristic selected from the group consisting of a cross linking characteristic, a glass transition temperature, a decomposition temperature, and a molecular weight.

24. The method of claim 14 wherein heating controls formation of a photoresist layer critical dimension.

25. The method of claim 14 wherein heating is performed at 125 to 180 degrees Centigrade for 60 to 90 seconds.

* * * * *